United States Patent [19]

Düll et al.

[11] Patent Number: 4,984,130
[45] Date of Patent: Jan. 8, 1991

[54] PASSIVE ELECTRIC COMPONENT

[75] Inventors: Helmut L. Düll, Heide; Horst W. Flunkert, Norderstedt, both of Fed. Rep. of Germany

[73] Assignee: U.S. Philips Corporation, New York, N.Y.

[21] Appl. No.: 512,631

[22] Filed: Apr. 12, 1990

Related U.S. Application Data

[63] Continuation of Ser. No. 928,148, Nov. 7, 1986, abandoned.

[30] Foreign Application Priority Data

Jun. 7, 1986 [DE] Fed. Rep. of Germany ....... 3619212

[51] Int. Cl.$^5$ ............... H01G 1/147; H01C 1/142; H05K 1/16
[52] U.S. Cl. ................ 364/321; 338/327; 361/402
[58] Field of Search ............ 361/321, 400, 402, 404, 361/410; 338/327

[56] References Cited

U.S. PATENT DOCUMENTS

| | | | |
|---|---|---|---|
| 1,864,336 | 6/1932 | Bradley | 338/332 X |
| 2,022,314 | 11/1935 | Heyroth et al. | 338/327 X |
| 2,083,339 | 6/1937 | Megow | 338/272 |
| 2,148,607 | 2/1939 | De Lange | 361/321 X |
| 2,552,653 | 5/1951 | Stupakoff | 381/321 |
| 3,444,436 | 5/1969 | Coda | 361/321 X |
| 4,326,239 | 4/1982 | Ohsawa et al. | 361/402 X |
| 4,356,529 | 10/1982 | Kopel | 361/321 X |
| 4,574,262 | 3/1986 | Hamazawa et al. | 336/200 X |

Primary Examiner—Donald A. Griffin
Attorney, Agent, or Firm—Norman N. Spain

[57] ABSTRACT

A passive electric component suitable for SMD-technique and having a cylindrical supporting member or a supporting member in the form of a rectangular parallelepiped and having electric connection elements at its ends which surround the supporting member in the form of a tube and do not cover the end faces of the supporting member.

14 Claims, 3 Drawing Sheets

PASSIVE ELECTRIC COMPONENT

This is a continuation of application Ser. No. 928,148, filed Nov. 7, 1986, and now abandoned.

BACKGROUND OF THE INVENTION

1. Field of the Invention

The invention relates to a passive electric component suitable for SMD-technique and having a cylindrical supporting member or a supporting member in the form of a rectangular parallelepiped and having electric connection elements at its ends.

2. Description of the Prior Art

It is known to contact passive electric components having, for example, a cylindrical supporting member, with connection caps which are provided at the end faces of the supporting member and to which connection wires are welded (FIG. 1).

Modern methods of mounting components use the possibility of soldering the components directly to conductor tracks of printed circuit boards without the use of connection wires. Said technology is used to an ever increasing extent under the indication "Surface Mounted Device" (SMD).

Components, in particular resistors and capacitors suitable for the SMD technique, are manufactured in two different constructions: as a so-called chip component and as a so-called MELF component. Chip components generally have supporting members in the form of rectangular parallelepipeds which have end faces suitable for soldering. MELF components (MELF=Metal Electrode Face Bonding) start from cylindrical supporting members having connection caps in which the connection wires are omitted and the caps themselves are made suitable for soldering at their surfaces by an electroplating treatment and are soldered directly with said connection caps to conductor tracks of printed circuit boards (FIG. 2).

The great advantage of the SMD technology is that extremely high packing densities of components on the printed circuit boards are possible. For realizing over increasing densities, smaller and smaller components suitable for the SMD technique become necessary.

Limits are imposed in two respects upon the miniaturization of passive components of the type mentioned in the preamble; first of all, supporting members and connection contacts cannot be made smaller arbitrarily for mechanical reasons and hence manufacturing reasons, secondly, such components cannot be made smaller arbitrarily with a view to required electrical characteristics.

SUMMARY OF THE INVENTION

It is the object of the invention to improve the passive component mentioned in the opening paragraph in such a manner that either improved electrical characteristics are obtained with equally large dimensions, or that the length of the component is reduced with the electrical characteristics remaining the same.

According to the invention this object is achieved in that the connection elements surround the supporting member at its ends in a tubular manner and do not cover the end faces of the supporting member.

According to an advantageous further embodiment of the component according to the invention the connection elements leave the end faces of the supporting member entirely free. This results in the advantage that metal tubes which can easily be manufactured may be used for the connection elements, which tubes can be slid as sleeves on the supporting member and can be soldered thereto. It has so far been assumed by those skilled in the art that it is absolutely necessary in the so-called MELF components and in particular in film resistors to protect an electric functional layer, so, for example, the resistance layer, present on the supporting member by connection elements in the form of end caps sealed at the ends of the resistance body. It has surprisingly been found that a sufficient protection of the resistance layer present at the end faces of the supporting member can be achieved by a metal layer which is provided, for example, by electroplating and which must be provided anyway on the connection elements after providing same, so as to be able to then provide a layer of solder on the connection elements. Since the resistance layer is an electrically conductive layer, further electroplated layers can be provided thereon.

According to further advantageous embodiments of the component according to the invention, thick-film connection elements are provided on the supporting member from a suspension containing metal particles, or thin-film connection elements are provided on the supporting member by electroplating. Herewith the advantage is associated that connection elements of miniature dimensions can also be manufactured with great precision for the so-called micro components, whose length dimension is in the order of magnitude of 2 mm with a diameter of 0.8 mm.

According to a further advantageous embodiment of the passive component according to the invention the connection elements surround the end faces of the supporting member at its edge and leave the inner area of the end faces free. Herewith the advantage is obtained, in particular when using metal sleeves as connection elements, that the metal sleeves can be premanufactured so as to have an edge which is slightly flanged at one end.

Upon contacting the supporting members, the advantage is obtained that the edge of the metal sleeves which is slightly flanged at one end serves as an abutment for the supporting member, so that the supporting member cannot be slid through the metal sleeves. It is also possible, however, that metal sleeves not having an edge flanged slightly at one end are first slid over the supporting member and the edge is deformed only during the contacting process so as to surround the edge of the supporting member in such a manner that the inner area of the end faces of the supporting member remains free. It is moreover advantageous that metal sleeves having a slightly flanged pre-manufactured edge are used for contacting the supporting members and that the slightly flanged edge of the metal sleeves are deformed once again by upsetting or compression in the direction to the supporting member during the contacting process. In this manner, length tolerances as they occur during the manufacture of in particular ceramic supporting members, and resulting from the manufacturing process thereof, can be compensated.

A particular advantage of the invention is that with a given length of the components a longer area of the supporting member remains free from connection elements than is the case with a component whose end face connection elements are in the form of connection caps. Since in the construction of the connection elements according to the invention the part of the known connection elements covering the end faces of the supporting member is omitted, the wall thickness of the bottom of the cap is gained as a free length between the connection elements, so the free length of the supporting member with the same component dimensions becomes larger by at least two times the thickness of the bottom of the cap.

This has very special advantages, in particular in the manufacture of cylindrical film resistors. The metal layer surface of film resistors is adjusted at a desired resistance value by cutting a spiral, for example, by means of lasers or grinding disks. Since the free length between the connection elements with the connection elements according to the invention becomes larger as compared with the known resistors of the same overall component length which have connection caps as connection elements, significantly more area is available for an adjusting step. In the manufacture of high-ohmic film resistors the number of spirals manufactured with the adjusting process plays an essential role.

BRIEF DESCRIPTION OF THE DRAWINGS

Embodiments of the invention are shown in the drawing, in which.

DESCRIPTION OF THE PREFERRED EMBODIMENTS

Figure 1:
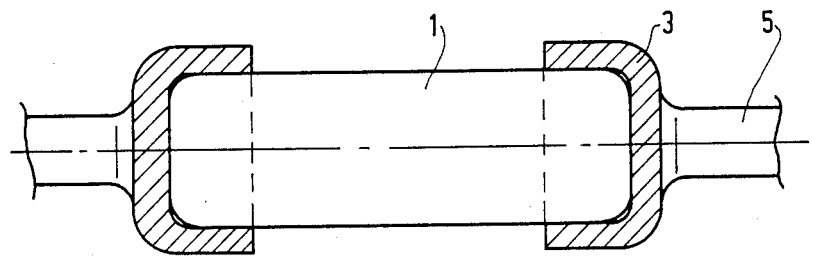
FIGS. 1 and 2 show prior art passive cylindrical components.
Figure 2:
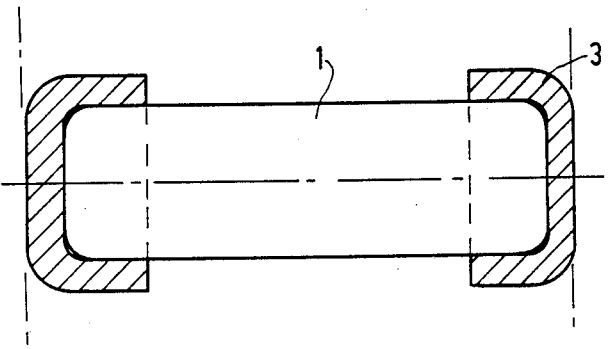

FIGS. 1 and 2 show prior art passive electric components having cylindrical supporting members 1 and connection elements 3 in the form of metal caps at their end faces.

The component shown in FIG. 1 comprises connection wires 5 at the connection elements 3 which are bent and soldered in apertures of printed circuit boards for the assembly of the components.

FIG. 2 shows an MELF component in which only metal caps are available as connection elements 3, which caps are soldered directly to conductor paths of printed circuit boards for the assembly of the components.

FIGS. 3 to 8 are sectional views of passive electric components according to the invention.

Figure 3:
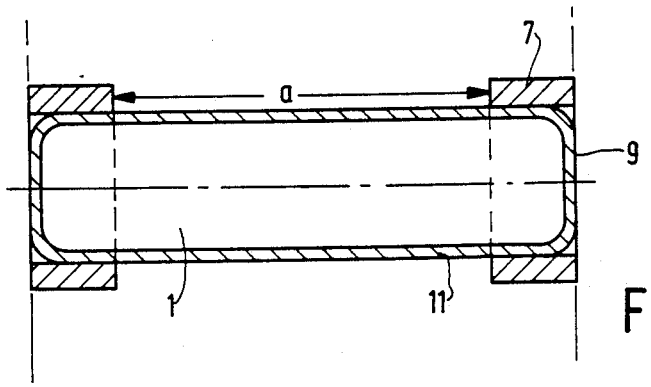
FIGS. 3 and 4 are sectional views of passive cylindrical electric components according to the invention with connection elements in various forms.

FIG. 3 shows a passive electric component having a cylindrical supporting member 1 which is provided with connection elements 7 which surround the supporting member 1 in the form of a tube and leave the end faces 9 of the supporting member 1 entirely free. Said connection elements 7 in the form of metal sleeves can be slid on the supporting member 1 and soldered thereto, but they may alternatively be formed as a thick-film contact from a suspension containing metal particles or as a thin-film contact deposited by electroplating. It appears from a comparison of FIGS. 2 and 3 that, by omitting the bottom of the caps of the known connection elements, the wall thickness of the bottom of the cap is gained as a free length between the connection elements 7, so the free length a of the supporting member 1 with the component dimensions remaining the same becomes larger by at least two times the thickness of the bottom of the cap. As already described above, this has the advantage, in particular in the manufacture of film resistors, that considerably more area is available for an adjusting process by cutting a spiral in a resistance layer present on the supporting member 1, which is of importance in particular in the manufacture of high-ohmic film resistors.

With dimensions of the component remaining the same, the electric characteristics of the components according to the invention can considerably be improved in this manner as compared with the known components, as appears from the comparative values for the resistance value $R_N$ recorded in the following table. Moreover it will be obvious from the table that in resistors of small dimensions the resistance value $R_N$ for resistors according to the invention increases overproportionally, which means an essential advantage for the components having connection elements according to the invention.

TABLE

| Film resistor having cap-shaped connection elements according to the prior art | | | Film resistor having sleeve-shaped connection elements according to the invention | | |
| --- | --- | --- | --- | --- | --- |
| Diameter of the supporting member (mm) | Overall length (mm) | Resistance value $R_N$ ($\Omega$)* | Diameter of the supporting member (mm) | Overall length (mm) | Resistance value $R_N$ ($\Omega$)* |
| 1,0 | 3,6 | $650 \cdot 10^3$ | 1,0 | 3,6 | $850 \cdot 10^3$ |
| 0,8 | 3,0 | $300 \cdot 10^3$ | 0,8 | 3,0 | $420 \cdot 10^3$ |
| 0,8 | 2,0 | $80 \cdot 10^3$ | 0,8 | 2,0 | $210 \cdot 10^3$ |
| 0,6 | 1,7 | $10 \cdot 10^3$ | 0,6 | 1,7 | $80 \cdot 10^3$ |

*Starting from an equal film resistance of 1000 $\Omega$ with the same spiral pitch of 0.2 mm at 0.08 mm cutting width.

Figure 4:
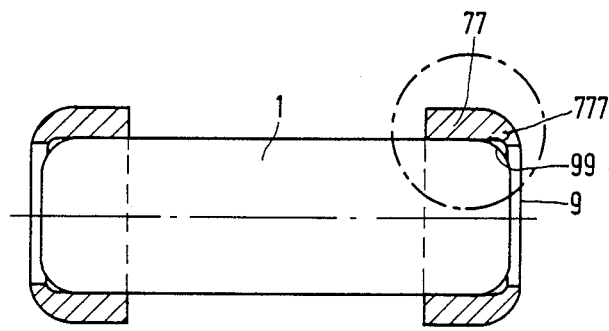
Figure 5:
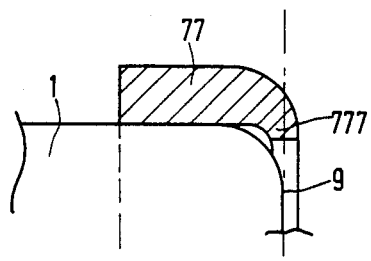
FIG. 5 shows a detail of a connection element according to FIG. 4, FIGS. 6 and 7 show details of a connection element shown in FIG. 4 in different forms determined by the contacting process.

FIG. 4, and the detail of FIG. 5, show a passive electric component according to the invention with connection elements 77 which differ from the connection elements 7 of FIG. 3 in that they surround the end faces 9 at their edge 99 and leave the inner area of the end faces 9 free. For example, pre-manufactured metal sleeves having an edge 777 which is slightly flanged at one side are used as connection elements 77 for this construction. As a result of this the advantage is obtained that the edge 777 which is slightly flanged at one side serves as an abutment for the supporting member 1. When metal sleeves having a flanged edge at one side are used as connection elements, the further advantage is obtained that during the contacting process length tolerances as they occur in the manufacture of ceramic supporting members can be compensated for.

Figure 6:
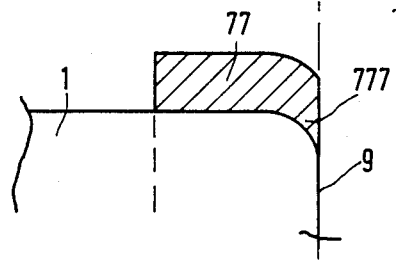
Figure 7:
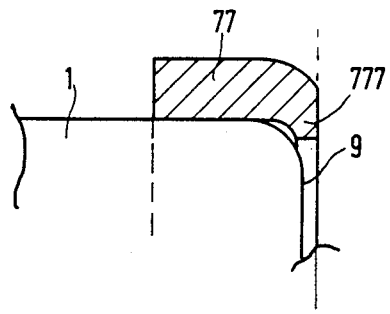

FIGS. 6 and 7 are diagrammatic details of this adaptation of the connection elements 77 to different lengths of the supporting member 1.

FIG. 6 shows a component having a supporting member 1 of maximum length in which the flanged edge 777 of the connection element 77 during the contacting process was deformed so that the overall length of the resulting contacted component corresponds to the length of the supporting member 1.

FIG. 7 shows a component having a supporting member 1 of minimum length in which the flanged edge 777 of the connection element 77 during the contacting process is less deformed as compared with the flanged edge 777 of FIG. 6 so that in the final product again a previously given overall length of the component is achieved in spite of a shorter supporting member 1.

Figure 8:
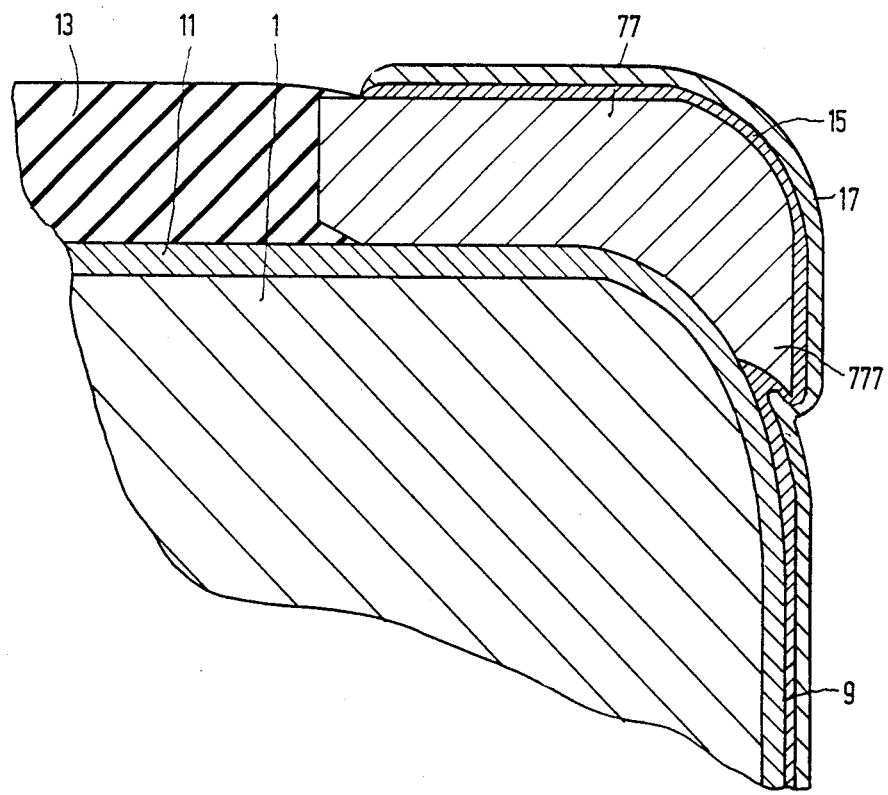
FIG. 8 is a diagrammatic sectional view of a detail of a finished film resistor according to the invention.

FIG. 8 shows a detail of a finished film resistor with connection elements according to the invention.

The electric functional layer in the form of a resistance layer 11 is coated with an insulating layer 13 of, for example, an insulating synthetic resin at the area between the connection elements 77 with flanged edges 777. Subsequently, upon providing the connection elements 77, 777 with a solderable coating 15, 17 which according to the present state of the art is realized by a multilayer construction of, for example, an electroplated copper layer 15 and a layer of solder 17, for example, of tin or lead-tin, the end faces 9 of the supporting member 1 not covered by the connection elements 77, 777 are also coated by electroplating since the resistance layer 11 present on the end faces 9 is electrically conductive. The continuous coating 15, 17, hermetically seals the functional layer 11 from environmental influences and the additional protection by a bottom of a connection element covering the end face of the supporting member is not necessary to realized components of good quality, for example, components having a good resistance to aging.

The manufacture of film resistors has been described by way of example. However, the connection elements may also be used for the manufacture of capacitors and inductors having cylindrical supporting members or supporting members in the form of a rectangular parallelepiped.

What is claimed is:

1. A passive electric component suitable for surface mounting comprising:
   an elongated supporting member carrying a layer of electrical component material and having a pair of conductive termination areas for said layer at the circumferential perimeter of said supporting member proximate respective opposite end faces of said supporting member; and
   surface mounting means comprising a pair of electrical connection elements at opposite ends of said supporting member respectively surrounding the circumferential perimeter of said supporting member and being in electrical contact with said pair of conductive termination areas, said electrical connection elements having open outward ends substantially flush with the respective end faces of said supporting member,
   whereby said electrical component has an overall length measured between the opposite open outward ends of said electrical connection elements, and the area of the portion of said electrical component which is free of said electrical connection elements is maximized relative to said overall length.

2. A passive electric component as claimed in claim 1, characterized in that the connection elements (77, 777) leave the end faces (9) of the supporting member (1) entirely free.

3. A passive electric component as claimed in claim 1, characterized in that the connection elements (77, 777) surround the end faces (9) of the supporting member (1) at its edge (9) and abut on outer area of the end faces (9) but do not cover an inner area of the end faces (9).

4. The component of claim 1 wherein said supporting member is a cylindrical body and said connection elements are tubular sleeves.

5. The component of claim 1 wherein said supporting member is a rectangular parallelepiped and said connection elements are sleeves having a generally rectangular shape 6. A passive electric component as claimed in any one of the preceding claims 1 to 5, characterized in that the connection elements (77, 777) are formed as individually manufactured cylindrical metal sleeves.

7. A passive electric component as claimed in any one of claims 1 to 5, characterized in that thick-film connection elements (77, 777) are provided on the supporting member from a suspension comprising metal particles.

8. A passive electric component as claimed in any one of claims 1 to 5, characterized in that electroplated thin-film connection elements (77, 777) are provided on the supporting member (1).

9. A passive electric component as claimed in any one of claims 1 to 5, characterized in that the supporting member consists of an electrically insulating ceramic.

10. A passive electric component as claimed in claim 9, characterized in that it is an electric resistor.

11. A passive electric component as claimed in any one of claims 1 to 5, characterized in that the supporting member (1) consists of a dielectric ceramic.

12. A passive electric component as claimed in claim 11 characterized in that it is a capacitor.

13. A passive electric component as claimed in any one of claims 1 to 5, characterized in that the supporting member (1) consists of a ferrite.

14. A passive electric component as claimed in claim 13, characterized in that it is an inductor.

* * * * *